(12) United States Patent
Li

(10) Patent No.: US 12,431,465 B2
(45) Date of Patent: Sep. 30, 2025

(54) CHIP PACKAGE AND METHOD OF FORMING CHIP PACKAGES

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 15 days.

(21) Appl. No.: 17/566,661

(22) Filed: Dec. 30, 2021

(65) Prior Publication Data
US 2022/0208733 A1    Jun. 30, 2022

(30) Foreign Application Priority Data
Dec. 31, 2020   (CN) .......................... 202011627702.4

(51) Int. Cl.
*H01L 25/065*  (2023.01)
*H01L 21/56*   (2006.01)
(Continued)

(52) U.S. Cl.
CPC ........ *H01L 25/0657* (2013.01); *H01L 21/561* (2013.01); *H01L 21/568* (2013.01);
(Continued)

(58) Field of Classification Search
CPC . H01L 25/0657; H01L 21/561; H01L 21/568; H01L 23/3107; H01L 23/49811;
(Continued)

(56) References Cited

U.S. PATENT DOCUMENTS

| 2010/0133704 A1 | 6/2010 | Marimuthu et al. |
| 2011/0024916 A1* | 2/2011 | Marimuthu ............. H01L 24/24 |
| | | 257/E21.511 |

(Continued)

FOREIGN PATENT DOCUMENTS

| CN | 101425510 A | 5/2009 |
| CN | 102104035 A | 6/2011 |

(Continued)

OTHER PUBLICATIONS

Shanghai Yibu Semiconductor Co., Ltd., First Office Action, CN 202011627702.4, Jul. 4, 2023, 7 pgs.
(Continued)

*Primary Examiner* — Timor Karimy
(74) *Attorney, Agent, or Firm* — USCH Law, PC

(57) ABSTRACT

A method of forming a package comprises assembling at least one chip layer over a carrier substrate, the at least one chip layer including chip couplers and chips, each of the chips having a front side facing the carrier substrate and chip contacts formed on the front side, the couplers including first chip couplers, each of the first chip couplers having an upper side facing away from the carrier substrate and first bumps formed on the upper side. The method further comprises encapsulating the at least one chip layer to form a molded package structure, thinning the molded package structure to expose the first bumps, forming a metal layer on a side of the molded package structure where the first bumps are exposed, removing the carrier to expose another side of the molded package structure, and forming a redistribution layer and second bumps on the molded package structure.

20 Claims, 3 Drawing Sheets

(51) Int. Cl.
    *H01L 23/31*     (2006.01)
    *H01L 23/498*    (2006.01)
    *H01L 23/538*    (2006.01)

(52) U.S. Cl.
    CPC .... *H01L 23/3107* (2013.01); *H01L 23/49811* (2013.01); *H01L 23/5383* (2013.01); *H01L 23/5384* (2013.01); *H01L 23/5385* (2013.01)

(58) Field of Classification Search
    CPC ............. H01L 23/5383; H01L 23/5384; H01L 23/5385; H10B 80/00
    See application file for complete search history.

(56) References Cited

U.S. PATENT DOCUMENTS

| | | | |
|---|---|---|---|
| 2014/0225273 | A1 | 8/2014 | Thacker et al. |
| 2015/0010866 | A1 | 1/2015 | Osaki et al. |
| 2015/0130072 | A1 | 5/2015 | Wu |
| 2015/0325509 | A1 | 11/2015 | We et al. |
| 2017/0011993 | A1 | 1/2017 | Zhao |
| 2017/0047308 | A1 | 2/2017 | Ho |
| 2017/0162556 | A1* | 6/2017 | Lin ...................... H01L 23/544 |
| 2019/0035761 | A1 | 1/2019 | Goh et al. |
| 2019/0057940 | A1 | 2/2019 | Cheah et al. |
| 2019/0067248 | A1 | 2/2019 | Yoo |
| 2019/0088504 | A1 | 3/2019 | Ho |
| 2019/0355679 | A1 | 11/2019 | Wu |
| 2020/0091123 | A1 | 3/2020 | Sung |
| 2020/0203325 | A1 | 6/2020 | Lee |
| 2021/0125960 | A1* | 4/2021 | Huang .................... H01L 25/50 |

FOREIGN PATENT DOCUMENTS

| | | | |
|---|---|---|---|
| CN | 102768958 | A | 11/2012 |
| CN | 104885217 | A | 5/2015 |
| CN | 104704631 | A | 6/2015 |
| CN | 104810332 | A | 7/2015 |
| CN | 105118823 | A | 12/2015 |
| CN | 106206458 | A | 12/2016 |
| CN | 106463493 | A | 2/2017 |
| CN | 107644871 | A | 1/2018 |
| CN | 107818922 | A | 3/2018 |
| CN | 110114874 | A | 8/2019 |
| JP | 2005303039 | A | 10/2005 |
| JP | 2017204643 | A | 11/2017 |
| TW | 202032748 | A | 9/2020 |
| TW | 202038354 | A | 10/2020 |
| WO | WO2012126379 | A1 | 9/2012 |
| WO | WO2016165074 | A1 | 10/2016 |
| WO | WO2017160284 | A1 | 9/2017 |

OTHER PUBLICATIONS

Shanghai Yibu Semiconductor Co., Ltd. First Office Action and Search Report, TW 110148083, Oct. 6, 2022, 12 pgs.
Weiping Li, U.S. Appl. No. 17/535,985, Non-Final Office Action issued Sep. 22, 2023.
Weiping Li, U.S. Appl. No. 17/535,987, Non-Final Office Action issued Nov. 8, 2023.
Weiping Li, U.S. Appl. No. 17/535,984, Non-Final Office Action issued May 8, 2023.
Weiping Li, U.S. Appl. No. 17/535,984, Final Office Action issued Aug. 21, 2023.
Weiping Li, U.S. Appl. No. 17/535,984, Advisory Action dated Nov. 6, 2023.
Weiping Li, U.S. Appl. No. 17/535,984, Response to Non-Final Office Action issued Aug. 8, 2023.
Weiping Li, U.S. Appl. No. 17/535,984, Response to Final Office Action filed Oct. 23, 2023.
Weiping Li, U.S. Appl. No. 17/535,984, Examiner Interview Summary filed Nov. 3, 2023.
Shanghai Yibu Semiconductor Co., Ltd., First Office Action, TW 110148083, Oct. 6, 2022, 9 pgs.
Shanghai Yibu Semiconductor Co., Ltd., Search Report, TW 110148083, Oct. 6, 2022, 1 pg.
Yibu Semiconductor (Shanghai) Co., Ltd., First Office Action, KR 10-2021-0177222, Feb. 27, 2024, 15 pgs.
Yibu Semiconductor (Shanghai) Co., Ltd., English Translation of First Office Action, KR 10-2021-0177222, Feb. 27, 2024, 11 pgs.
Shanghai Yibu Semiconductor Co., Ltd., First Office Action, CN 202011352636.4, Apr. 20, 2021, 12 pgs.
Shanghai Yibu Semiconductor Co., Ltd., Second Office Action, CN 202011352636.4, Jun. 8, 2021, 10 pgs.
Shanghai Yibu Semiconductor Co., Ltd., Third Office Action, CN 202011352636.4, Jul. 27, 2023, 9 pgs.
Shanghai Yibu Semiconductor Co., Ltd., First Office Action, TW 110144187, Apr. 19, 2022, 7 pgs.
Shanghai Yibu Semiconductor Co., Ltd., Search Report, TW 110144187, Apr. 19, 2022, 1 pg.
Shanghai Yibu Semiconductor Co., Ltd., First Office Action, KR 10-2021-0163984, Sep. 5, 2023, 6 pgs.
Yibu Semiconductor (Shanghai) Co., Ltd., First Office Action, CN 202011359780.0, Apr. 22, 2021, 11 pgs.
Yibu Semiconductor (Shanghai) Co., Ltd., English Translation of First Office Action, CN 202011359780.0, Apr. 22, 2021, 13 pgs.
Yibu Semiconductor (Shanghai) Co., Ltd., Second Office Action, CN 202011359780.0, Jun. 24, 2021, 8 pgs.
Yibu Semiconductor (Shanghai) Co., Ltd., English Translation of Second Office Action, CN 202011359780.0, Jun. 24, 2021, 14 pgs.
Weiping Li, U.S. Appl. No. 17/535,985, Response to Non-Final Office Action, filed Dec. 22, 2023.
Weiping Li, U.S. Appl. No. 17/535,985, Final Office Action, issued Apr. 3, 2024.
Weiping Li, U.S. Appl. No. 17/535,987, Response to Non-Final Office Action, filed Feb. 8, 2024.

* cited by examiner

101

110

Assembling at least one chip layer on a carrier substrate, each chip layer including a plurality of chips and having a front side facing the carrier substrate, the at least one chip layer further including chip couplers, each chip coupler having a first side facing the carrier substrate, an opposing second side facing away from the carrier substrate and through vias between the first side and the second side, at least some of the chip couplers having first bumps formed on the second side.

120

Encapsulate the at least one chip layer in a molding compound to form a molded package structure on the carrier substrate

130

Thinning the molded package body to expose the first bumps and forming a metal layer over the molded package structure

140

Removing the carrier substrate to expose a front side of a chip layer, forming a redistribution on the exposed front side of the chip layer and solder bumps on a side of the redistribution layer facing away from the chip layer, and dicing the molded package structure to obtain individual packages

FIG. 1

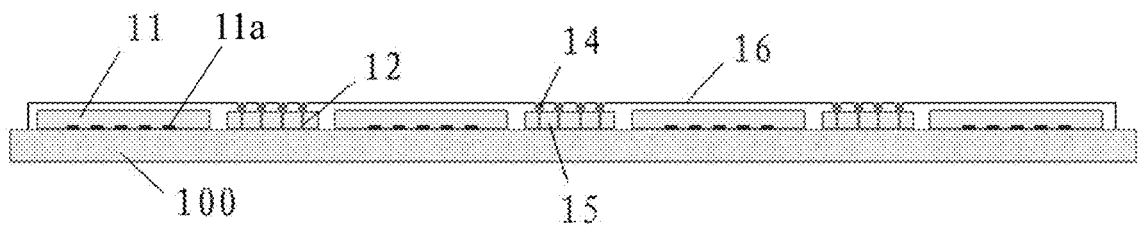

FIG. 2

FIG. 3

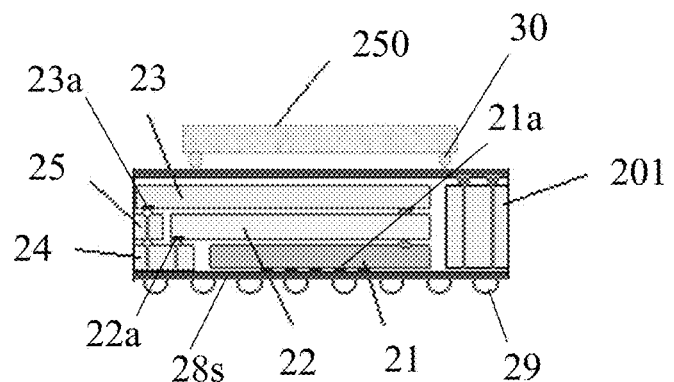
FIG. 9
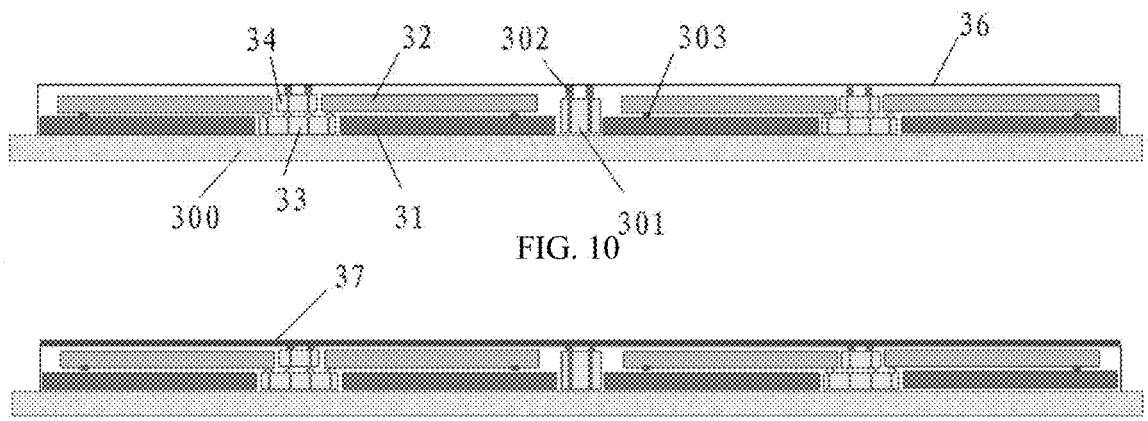
FIG. 10
FIG. 11
FIG. 12
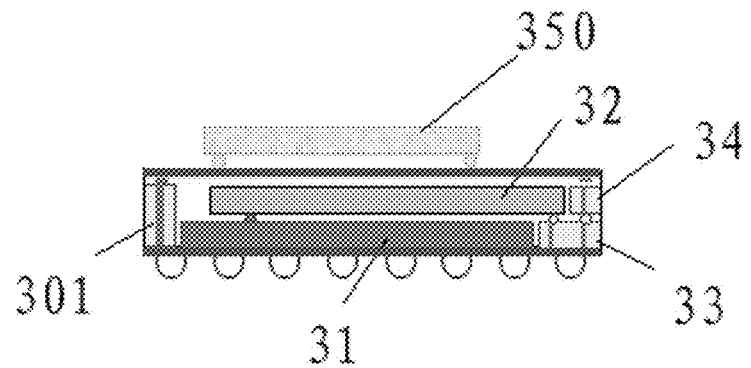
FIG. 13

CHIP PACKAGE AND METHOD OF FORMING CHIP PACKAGES

CROSS REFERENCE TO RELATED APPLICATIONS

This application claims the benefit of priority under the Paris Convention to Chinese Patent Application No. CN 202011627702.4, filed Dec. 31, 2020, entitled "Package and Method of Forming the Same," which is incorporated by reference herein in its entirety. This application is related to co-pending U.S. patent application Ser. No. 17/535,984, filed Nov. 26, 2021, U.S. patent application Ser. No. 17/535,985, filed Nov. 26, 2021, and U.S. patent application Ser. No. 17/535,987, filed Nov. 26, 2021, each of which is incorporated by reference herein in its entirety.

FIELD OF THE INVENTION

The present application relates to the technical field of semiconductors, particularly to chip packages and method of forming chip packages.

BACKGROUND

As the functions of semiconductor integrated circuits are ever expanding, and the computation speed gets faster and faster, more and more investment is made in the development of chip stacking technology to find more effective solutions. Wafer Level Packaging (WLP) is the technology of packaging an integrated circuit while it is still part of a wafer, in contrast to the more conventional method of slicing the wafer into individual chips (dice) and then packaging them. WLP allows integration of wafer fab, packaging, test, and burn-in at wafer level to streamline the manufacturing process undergone by a device from silicon start to customer shipment. Current WLP technology, however, does not allow chip-stacking. Thus, in conventional chip stacking technology, stacking is mostly carried out in final assembly, and vertical connection between stacked chips needs to be realized using technologies such as Through Silicon Via (TSV), Through Glass Via (TGV), Through Mold Via (TMV), or Wire-bond (Wire-bond). As a result, the packaging process of conventional chip-stacking techniques is complicated and costly.

SUMMARY

Some embodiments provide a solution for forming a package including stacked chips.

According to some embodiments, a method of forming a package comprises placing a chip layer over a carrier, the chip layer including a plurality of chip couplers or connectors and a plurality of chips facing the carrier. In some embodiments, the plurality of chip connectors has a plurality of first bumps on a side thereof facing away from the carrier. The method further comprises: molding the chip layer above the carrier to form a molded package structure; thinning the molded package structure to expose the plurality of first bumps; adding a metal layer above the thinned molded package structure; removing the carrier to form a package main body, and adding a redistribution or rewiring layer and a second bump below the package main body; and dividing the package main body to form a plurality of the packages.

The plurality of chip connectors may be active coupling devices or passive coupling devices.

The plurality of chip connectors may be arranged to include at least one conductive channel in a vertical direction.

In some embodiments, a package thus formed include at least one chip coupler or chip coupler segment. In some embodiments, a first chip, and a segmented portion of the metal layer. In some embodiments, the first chip may be electrically coupled to the segmented portion of the metal layer through the at least one chip coupler or chip coupler segment and the rewiring layer.

The plurality of chip connectors are formed from one or more semiconductor materials, one or more inorganic materials, one or more organic materials, and/or one or more metallic materials.

One or more of the following electronic devices may be integrated within the metal layer: I/O ports, passive devices, radio frequency antennas, electromagnetic interference shielding devices, and heat dissipation devices.

The plurality of chip connectors may be formed of one or more of the following semiconductor materials: silicon, silicon carbide, gallium arsenide, and gallium nitride.

The plurality of chip connectors may be formed of one or more of the following inorganic materials: glass and ceramic.

The plurality of chip connectors may be formed from one or more of the following packaging substrate processes and materials: printed circuit board, molded encapsulation base plate and flexible circuit substrate.

The plurality of chip connectors may be formed by processes and materials of a metal substrate, and the metal substrate adopts one or more of the following metal materials and alloy materials thereof: copper, aluminum and iron.

One or more of the following electronic devices, e.g., integrated circuit modules, micro-electro-mechanical systems, optoelectronic devices, and passive devices, may be placed and assembled over the metal layer.

According to some embodiments, a chip package comprises: a rewiring layer including a first side and a second side; a plurality of first bumps disposed on a first side of the redistribution layer; a chip comprising a front side and a back side, the chip being placed face down and assembled on a second side of the redistribution layer; at least one chip connector including a front surface and a back surface, the at least one chip connector being placed and assembled with the front surface facing the carrier on the second side of the redistribution layer and horizontally placed at a side surface of the at least one first chip; a plurality of second bumps disposed over the at least one chip connector; and a metal layer disposed and assembled over the package and electrically coupled to at least one of the plurality of second bumps. In some embodiments, the package is molded into a molded structure.

The at least one chip connector may be an active coupling device or a passive coupling device.

The at least one chip connector may be arranged to contain at least one conductive channel in a vertical direction.

The chip can be electrically coupled to the metal layer through the at least one chip connector and the redistribution layer.

The at least one chip connector may be formed of one or more semiconductor materials, one or more inorganic materials, one or more organic materials, and/or one or more metallic materials.

One or more of the following electronic devices may be integrated within the metal layer, e.g., I/O ports, passive devices, radio frequency antennas, electromagnetic interference shielding devices, and heat dissipation devices.

The at least one chip connector may be formed of one or more of the following semiconductor materials: silicon, silicon carbide, gallium arsenide, and gallium nitride.

The at least one chip connector may be formed of one or more of the following inorganic materials, e.g., glass and ceramic.

The at least one chip connector may be formed from one or more of the following packaging substrate processes and materials: printed circuit board, molded encapsulation base plate and flexible circuit substrate.

The at least one chip connector may be formed by a process and a material of a metal substrate, and the metal substrate may be made of one or more of the following metal materials and alloy materials thereof: copper, aluminum and iron.

One or more of the following electronic devices may be placed and assembled over the metal layer: integrated circuit modules, micro-electro-mechanical systems, optoelectronic devices, and passive devices.

According to some embodiments, a method of forming a package comprises: placing at least one first chip layer over a carrier, each of the first chip layers including a plurality of first chip connectors, a plurality of second chip connectors, and a plurality of first chips facing the carrier; placing and assembling a second chip layer over the at least one first chip layer, the second chip layer comprising a plurality of second chips facing the carrier and a plurality of third chip connectors. In some embodiments, a side of the plurality of third chip connectors facing away from the carrier has a plurality of first bumps. The method further comprising molding the at least one first chip layer and the second chip layer above the carrier to form a molded package structure; thinning the molded package structure to expose the plurality of first bumps; adding a metal layer above the thinned molded package structure; removing the carrier to form a package main body, and adding a rewiring layer and a second bump below the package main body; and dividing the package main body to form a plurality of the packages.

The plurality of first chip connectors may be active or passive coupling devices, the plurality of second chip connectors are active or passive coupling devices, and the plurality of third chip connectors are active or passive coupling devices.

The plurality of first chip connectors, the plurality of second chip couplers and the plurality of third chip couplers may be arranged to contain at least one conductive channel in a vertical direction.

Each first chip coupler in a first chip coupler stack formed of a plurality of first chip couplers located in different first chip layers may differ in sizes in a horizontal direction (e.g., areas of cross-sections parallel to a surface of the carrier over which the chip layers are assembled).

A second chip coupler stack formed by a plurality of second chip couplers located in different first chip layers can be integrally formed with a third chip coupler stacked on the second stack.

Each second chip coupler in the second chip coupler stack may have the same area in a horizontal direction as a third chip coupler stacked on the second chip coupler stack.

The package may include a plurality of first bumps, at least one first chip, a second chip, at least one segmented first chip coupler, at least one segmented second chip coupler, a segmented third chip coupler, and a segmented metal layer. In some embodiments, the second chip may be electrically coupled to the at least one first chip through the at least one segmented first chip coupler and the re-wiring layer, or the second chip may be electrically coupled to the at least one first chip through the at least one segmented first chip coupler. In some embodiments, the second chip may be electrically coupled to the segmented metal layer through the at least one segmented first chip coupler, the re-wiring layer, the at least one segmented second chip coupler, the segmented third chip coupler, and the plurality of first bumps. In some embodiments, the at least one first chip is electrically coupleable to the segmented metal layer through the re-wiring layer, the at least one segmented second chip coupler, the segmented third chip coupler, and the plurality of first bumps.

The plurality of first chip couplers, the plurality of second chip couplers, and the plurality of third chip couplers may be formed of one or more semiconductor materials, one or more inorganic materials, one or more organic materials, and/or one or more metallic materials.

One or more of the following electronic devices may be integrated within the metal layer: I/O ports, passive devices, radio frequency antennas, electromagnetic interference shielding devices, and heat dissipation devices.

The plurality of first chip couplers, the plurality of second chip couplers, and the plurality of third chip couplers may be formed of one or more semiconductor materials as follows: silicon, silicon carbide, gallium arsenide, and gallium nitride.

The plurality of first chip couplers, the plurality of second chip couplers, and the plurality of third chip couplers may be formed of one or more inorganic materials as follows: glass and ceramic.

The plurality of first chip connectors, the plurality of second chip connectors, and the plurality of third chip connectors may be formed from one or more of the following package substrate processes and materials: printed circuit board, molded encapsulation base plate and flexible circuit substrate.

The plurality of first chip connectors, the plurality of second chip connectors, and the plurality of third chip connectors may be formed by a process and a material of a metal substrate, and the metal substrate may be made of one or more of a metal material and an alloy material thereof as follows: copper, aluminum and iron.

One or more of the following electronic devices may be placed and assembled over the metal layer: integrated circuit modules, micro-electro-mechanical systems, optoelectronic devices, and passive devices.

According to some embodiments, a chip package comprises: a rewiring layer including a first side and a second side; a plurality of first bumps disposed on a first side of the redistribution layer; at least one first chip comprising a front side and a back side. In some embodiments, a chip stack formed by the at least one first chip is placed face down and assembled on the second side of the redistribution layer; at least one first chip coupler comprising a front side and a back side. In some embodiments, a chip coupler stack formed by the at least one first chip coupler is placed face down and assembled on the second side of the redistribution layer and horizontally spaced from one side of the at least one first chip; a cross-layer chip coupler placed and assembled on a second side of the redistribution layer and horizontally spaced from the other side of the at least one first chip; a second chip comprising a front side and a back side, the second chip being placed face down over the back side of the at least one first chip and assembled over the at least one first chip coupler; a plurality of second bumps disposed over the cross-layer chip connectors; and a metal layer disposed over the package and electrically coupled to at least one of the plurality of second bumps. In some embodiments, the package is molded into a molded package structure.

The at least one first chip coupler may be an active coupling device or a passive coupling device, and the cross-layer chip coupler is an active coupling device or a passive coupling device.

The at least one first chip coupler and the cross-layer chip coupler may be arranged to contain at least one conductive channel in a vertical direction.

Each first chip coupler in the chip coupler stack may have a different sizes (e.g., areas) in a horizontal direction (e.g., parallel to a surface of the carrier over which the chip layers are assembled).

The second chip can be electrically coupled to the at least one first chip through the at least one first chip coupler and the redistribution layer, or the second chip can be electrically coupled to the at least one first chip through the at least one first chip coupler. In some embodiments, the second chip can be electrically coupled to the metal layer through the at least one first chip coupler, the redistribution layer, the cross-layer chip coupler, and the plurality of first bumps. In some embodiments, the at least one first chip can be electrically coupled to the metal layer through the redistribution layer, the cross-layer chip coupler, and the plurality of first bumps.

The at least one first chip coupler and the cross-layer chip coupler may be formed of one or more semiconductor materials, one or more inorganic materials, one or more organic materials, and/or one or more metallic materials.

One or more of the following electronic devices may be integrated within the metal layer: I/O ports, passive devices, radio frequency antennas, electromagnetic interference shielding devices, and heat dissipation devices.

The at least one first chip coupler and the cross-layer chip coupler may be formed of one or more semiconductor materials: silicon, silicon carbide, gallium arsenide, and gallium nitride.

The at least one first chip coupler and the cross-layer chip coupler may be formed of one or more inorganic materials: glass and ceramic.

The at least one first chip coupler and the cross-layer chip coupler may be formed from one or more of the following package substrate processes and materials: printed circuit board, molded encapsulation base plate and flexible circuit substrate.

The at least one first chip coupler and the cross-layer chip coupler may be formed by a process and a material of a metal substrate, and the metal substrate adopts one or more of the following materials, metal materials and alloy materials thereof: copper, aluminum and iron.

One or more of the following electronic devices may be placed and assembled over the metal layer: integrated circuit modules, micro-electro-mechanical systems, optoelectronic devices, and passive devices.

According to some embodiments, a method of forming a package comprises: placing at least one first chip layer over a carrier, each of the first chip layers including a plurality of first chip couplers, a plurality of second chip couplers, and a plurality of first chips facing the carrier; placing and assembling a second chip layer over the first chip layer, the second chip layer including a plurality of second chips facing the carrier, a plurality of third chip couplers and a plurality of fourth chip couplers. In some embodiments, a side of the plurality of third chip couplers and the plurality of fourth chip couplers facing away from the carrier has a plurality of first bumps. The method further comprises molding the at least one first chip layer and the second chip layer above the carrier to form a molded package structure; thinning the molded package structure to expose the plurality of first bumps; adding a metal layer above the thinned molded package structure; removing the carrier to form a package main body, and adding a rewiring layer and a second bump below the package main body; and dividing the package main body to form a plurality of the packages.

The plurality of first chip couplers may be active coupling devices or passive coupling devices, the plurality of second chip couplers may be active coupling devices or passive coupling devices, the plurality of third chip couplers may be active coupling devices or passive coupling devices, and the plurality of fourth chip couplers may be active coupling devices or passive coupling devices.

The plurality of first chip couplers, the plurality of second chip couplers, the plurality of third chip couplers, and the plurality of fourth chip couplers may be arranged to contain at least one conductive channel in a vertical direction.

Each first chip coupler in a first chip coupler stack formed of a plurality of first chip couplers located in different first chip layers may differ in area in a horizontal direction from a third chip coupler stacked on the first chip coupler stack.

A second chip connector stack formed by a plurality of second chip connectors in different first chip layers and a fourth chip connector stacked on the second chip connector stack can be integrally molded.

Each second chip coupler in the second chip coupler stack may have the same area in the horizontal direction as a fourth chip coupler stacked on the second chip coupler stack.

The package may include at least one first chip, a second chip, at least one segmented first chip coupler, at least one segmented second chip coupler, a segmented third chip coupler, a segmented fourth chip coupler, and a segmented metal layer. In some embodiments, the second chip is electrically coupleable to the first chip through the at least one segmented first chip coupler and the re-wiring layer. In some embodiments, the second chip is electrically coupleable to the segmented metal layer through the at least one segmented first chip coupler, the re-wiring layer, the at least one segmented second chip coupler, and the segmented fourth chip coupler. In some embodiments, the segmented metal layer is electrically coupleable to the at least one first chip through the segmented third chip coupler, the at least one segmented first chip coupler, and the re-wiring layer.

The plurality of first chip couplers, the plurality of second chip couplers, the plurality of third chip couplers, and the plurality of fourth chip couplers may be formed of one or more semiconductor materials, one or more inorganic materials, one or more organic materials, and/or one or more metallic materials.

One or more of the following electronic devices may be integrated within the metal layer: I/O ports, passive devices, radio frequency antennas, electromagnetic interference shielding devices, and heat dissipation devices.

The plurality of first chip couplers, the plurality of second chip couplers, the plurality of third chip couplers, and the plurality of fourth chip couplers may be formed of one or more semiconductor materials as follows: silicon, silicon carbide, gallium arsenide, and gallium nitride.

The plurality of first chip couplers, the plurality of second chip couplers, the plurality of third chip couplers, and the plurality of fourth chip couplers may be formed of one or more inorganic materials as follows: glass and ceramic.

The plurality of first chip connectors, the plurality of second chip connectors, the plurality of third chip connectors, and the plurality of fourth chip connectors may be formed by one or more of the following processes and materials of a package substrate: printed circuit board, molded encapsulation base plate and flexible circuit substrate.

The plurality of first chip connectors, the plurality of second chip connectors, the plurality of third chip connectors, and the plurality of fourth chip connectors may be formed by a process and a material of a metal substrate, and the metal substrate may be formed of one or more of a metal material and an alloy material thereof as follows: copper, aluminum and iron.

One or more of the following electronic devices may be placed and assembled over the metal layer: integrated circuit modules, micro-electro-mechanical systems, optoelectronic devices, and passive devices.

According to some embodiments, a chip package comprises: a rewiring layer including a first side and a second side; a plurality of first bumps disposed on a first side of the redistribution layer; at least one first chip comprising a front side and a back side. In some embodiments, a chip stack formed by the at least one first chip is placed face down and assembled on the second side of the redistribution layer; at least one first chip coupler comprising a front side and a back side. In some embodiments, a chip coupler stack formed by the at least one first chip coupler is placed face down and assembled on the second side of the redistribution layer and horizontally spaced from one side of the at least one first chip; a cross-layer chip coupler placed and assembled on a second side of the redistribution layer and horizontally spaced from the other side of the at least one first chip; a second chip comprising a front side and a back side, the second chip being placed face down over the back side of the at least one first chip and assembled over the at least one first chip coupler; a second chip coupler placed and assembled over the at least one first chip coupler; a plurality of second bumps disposed over the second chip connectors and the cross-layer chip connectors; and a metal layer disposed and assembled over the package and electrically coupled to at least one of the plurality of second bumps. In some embodiments, the package is molded into a plastic structure.

The at least one first chip coupler may be an active coupling device or a passive coupling device, the cross-layer chip coupler may be an active coupling device or a passive coupling device, and the second chip coupler may be an active coupling device or a passive coupling device.

The at least one first chip coupler, the second chip coupler and the cross-layer chip coupler may be arranged to contain at least one conductive channel in a vertical direction.

Each first chip coupler in the chip-coupler stack may differ in area in a horizontal direction (e.g., area of a cross-section parallel to a surface of the carrier over which the chip layers are assembled) from a second chip coupler above the chip-coupler stack.

The second chip is electrically coupleable to the at least one first chip through the at least one first chip coupler and the redistribution layer. In some embodiments, the second chip is electrically coupleable to the metal layer through the at least one first chip coupler and the redistribution layer, the cross-layer chip coupler. In some embodiments, the metal layer is electrically coupleable to the at least one first chip through the second chip coupler, the at least one first chip coupler, and the redistribution layer.

The at least one first chip coupler, the second chip coupler, and the cross-layer chip coupler are formed of one or more semiconductor materials, one or more inorganic materials, one or more organic materials, and/or one or more metallic materials.

One or more of the following electronic devices may be integrated within the metal layer: I/O ports, passive devices, radio frequency antennas, electromagnetic interference shielding devices, and heat dissipation devices.

The at least one first chip coupler, the second chip coupler, and the cross-layer chip coupler may be formed of one or more semiconductor materials as follows: silicon, silicon carbide, gallium arsenide, and gallium nitride.

The at least one first chip coupler, the second chip coupler, and the cross-layer chip coupler may be formed of one or more inorganic materials: glass and ceramic.

The at least one first chip coupler, the second chip coupler, and the cross-layer chip coupler may be formed from one or more of the following package substrate processes and materials: printed circuit board, molded encapsulation base plate and flexible circuit substrate.

The at least one first chip coupler, the second chip coupler and the cross-layer chip coupler may be formed by a process and a material of a metal substrate, and the metal substrate adopts one or more of the following metal materials and alloy materials thereof: copper, aluminum and iron.

One or more of the following electronic devices may be placed and assembled over the metal layer: integrated circuit modules, micro-electro-mechanical systems, optoelectronic devices, and passive devices.

The embodiments described herein realize the stacking of the chips by using the chip connector and a one-stop wafer level fan-out or board level fan-out packaging process without using TSV and other technologies for vertically connecting the chips in the functional chips. Thus, the complexity and manufacturing cost of the three-dimensional multi-layer chip package is reduced.

In some embodiments, metal layers above the package is formed to enable coupling and stacking with other packages, or metal layers to integrate and add electronic devices with other functions to the package.

The foregoing description is only an overview of the technical solutions of some embodiments, which are described below in order to make the technical solutions more clearly understood and to make the above and other objects, features, and advantages of the embodiments more clearly understandable.

BRIEF DESCRIPTION OF THE DRAWINGS

The above and other objects, features and advantages of exemplary embodiments will become readily apparent from the following detailed description read in conjunction with the accompanying drawings. Several embodiments are illustrated by way of example, and not by way of limitation, in the figures of the accompanying drawings.

FIG. 1 shows a flow diagram of a method for forming a package according to some embodiments.

FIGS. 2-5 are cross-sectional views schematically illustrating a package being formed in process for forming a package according to some embodiments.

FIGS. 6-9 are cross-sectional views schematically illustrating a package being formed in process for forming a package according to some embodiments.

FIGS. 10-13 are cross-sectional views schematically illustrating a package being formed in process for forming a package according to some embodiments.

DETAILED DESCRIPTION OF THE EMBODIMENTS

Figure 4:
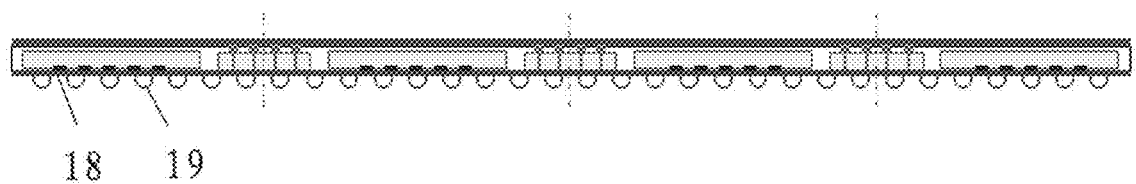

The following disclosure provides various embodiments, or examples, for implementing various features or solutions. Specific examples of components and arrangements are described below to simplify the present disclosure. These are, of course, merely examples and are not intended to limit the invention. For example, in the following description, forming a first feature over or on a second feature may include embodiments in which the first and second features are formed in direct contact, and may also include embodiments in which additional features may be formed between the first and second features, such that the first and second features may not be in direct contact. Further, the present application may repeat reference numerals and/or characters in the various embodiments. This repetition is for the purpose of simplicity and clarity and does not in itself dictate a relationship between the various embodiments and/or configurations discussed.

Also, spatially relative terms, such as "under . . . ," "below . . . ," "lower," "above . . . ," "upper," and the like, may be used herein for ease of description to describe one element or component's relationship to another element (or other) component as illustrated. Spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly. In addition, herein, the term "assembly" refers to various mechanically and/or electrically interconnected electronic devices. The term "chip" may refer to various types of chips, such as logic chips, storage chips, and the like.

FIG. 1 shows a flow diagram illustrating a method 101 of forming a package according to an embodiment. The method 101 comprises: Step 110, in which at least one chip layer is assembled on a carrier or carrier substrate. Each chip layer includes a plurality of chips and has a front side facing the carrier substrate (i.e., the plurality of chips are placed on the carrier face-down). The at least one chip layer further includes chip connectors. Each chip connector has a first side facing the carrier substrate, an opposing second side facing away from the carrier substrate and through vias between the first side and the second side. At least some of the chip connectors (or chip couplers) have first bumps formed on the second side. The method 101 further comprises Step 120, in which a molding process is performed to encapsulate the at least one chip layer in a molding compound to form a molded package body; Step 130, in which the molded package structure is thinned to expose the first bumps and a metal layer is formed over the molded package structure; and Step 140, in which the carrier substrate is removed to expose a front side of a chip layer, a redistribution or rewiring layer is formed on the exposed front side of the chip layer, solder bumps are formed on a side of the redistribution layer facing away from the chip layer, and the molded package structure is diced to obtain individual packages.

In some embodiments, the carrier is a high surface flatness component, and at least one chip layer may be stacked on the carrier. After the molding process is performed on the at least one chip layer, a molded package structure may be formed on the carrier. In some embodiments, the material used for the molding process may include solid or liquid molding materials starting from epoxy resins, organic polymers, or other compounds with or without silicon-based or glass fillers.

In some embodiments, the step of removing the carrier, the step of adding the redistribution layer and the bumps, and the step of dicing the package body are steps known in Wafer Level Packaging (WLP).

Various embodiments will be described below based on the above-described method and with reference to various figures.

FIGS. 2-5 are cross-sectional views schematically illustrating a package being formed in process 101 for forming a package according to some embodiments.

FIG. 2 shows a schematic cross-sectional view of a molded package structure including an encapsulated chip layer on a carrier substrate after Steps 110 and 120 are performed to form the molded package structure.

As shown in FIG. 2, a chip layer is assembled on the carrier 100. The chip layer includes a plurality of chips 11 and a plurality of chip connectors 15. In some embodiments, the plurality of chips 11 and the plurality of chip couplers 15 may be arranged on the carrier 100 spaced apart from each other. The chip includes a front side and a back side. In the art, a surface having, for example, bumps 11a is considered a front side of a chip. In some embodiments, the chip 11 is placed face down (e.g., having the front side facing the chip carrier 100.

As shown in FIG. 2, in some embodiments, each chip connector 15 has a lower surface facing the carrier and an upper surface facing away from the carrier. The upper surfaces of the plurality of chip connectors 15 may be provided with a plurality of first bumps 14. In some embodiments, the plurality of first bumps 14 may be in the form of metal pillars (e.g., copper pillars).

Herein, a chip connector may be used to electrically couple different electronic devices, including, for example, various devices such as chips, redistribution layers, and other chip connectors. An electronic device to which the chip connector is coupled is typically not in the same chip layer as the chip connector. In some embodiments, the chip couplers may be active or passive coupling devices. In some embodiments, a chip coupler may have several conductive channels in the vertical direction (e.g., conductive vias between the upper surface and the lower surface). The conductive vias may couple pads or bumps formed on the upper and lower surfaces of the chip connector. For example, as shown in FIG. 2, the chip connector 15 may include a plurality of through vias 12, which may be through holes filled with a conductive medium to form conductive paths. In other embodiments, the conductive paths coupling the upper and lower surfaces of the chip couplers may be formed in other ways. In some embodiments, conductive traces can be provided on both the upper and lower surfaces of a chip connector, such that electrical connections are made on one surface between different conductive vias, between bumps or pads formed to the chip connector, and between the conductive vias and the bumps or pads.

Herein, the chip connectors may be formed of silicon, silicon carbide, gallium arsenide, gallium nitride, and other semiconductor materials; the chip connectors may be formed from glass, ceramic, and other inorganic materials; the chip connector may be formed of Printed Circuit Substrates (PCBs), plastic Encapsulated Substrates (EMCs), flexible circuit substrates, metal substrate materials, and other packaging substrate processes and materials; the metal substrate can be made of metal materials such as copper, aluminum, iron and the like and alloy materials thereof. For example, each chip connector 15 can be formed using the method of forming chip connectors described in co-pending U.S. patent application Ser. No. 17/562,936, entitled "Chip Package and Method of Forming Chip Packages," filed Dec. 27, 2021, which is incorporated herein by reference in its entirety.

As shown in FIG. 2, the chip layer on the carrier 100 has been molded, thereby forming the molded package structure 16.

FIG. 3 shows a cross-sectional schematic diagram of a package structure after Step 130 is performed.

As shown in FIG. 3, the package structure 16 may be thinned to expose the plurality of first bumps 14. Then, a metal layer 17 is formed on the package structure 16. In some embodiments, the metal layer is electrically connected to the plurality of first bumps 14. In some embodiments, the metal layer may include a plurality of metal lines, at least one of the plurality of metal lines being connected to at least one of the plurality of first bumps 14.

Herein, by adding a metal layer on the molded package structure, various functional devices (i.e., electronic devices having specific functions) can be formed in the metal layer. The functional devices may include, for example, I/O ports, passive devices, radio frequency antennas, electromagnetic interference (EMI) shielding devices, heat dissipation devices, and/or the like. In some embodiments, certain functional devices may also be assembled on top of the metal layer. For example, an integrated circuit module, a Micro Electromechanical System (MEMS), an optoelectronic device, a passive device, or other electronic device may be used as a functional device assembled on the upper portion of the metal layer.

FIG. 4 shows a cross-sectional schematic view of a package structure after Step 140 is performed according to some embodiments.

Figure 5:
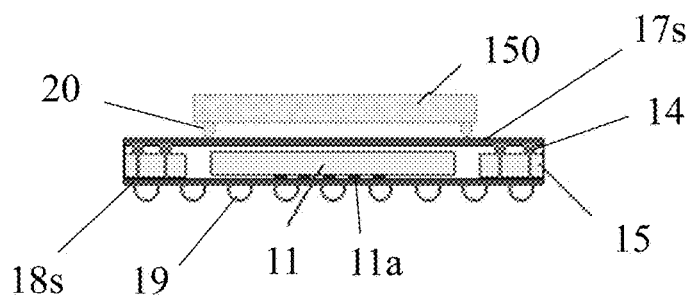

As shown in FIG. 4, the carrier 100 may be removed to form a package main body. Then, a redistribution layer 18 and second bumps 19 are formed on the lower side of the package main body (e.g., the side of the package main body facing away from the metal layer). Finally, the package structure shown in FIG. 4 is diced along the broken line shown in FIG. 4 to obtain individual packages, e.g., a package as shown in FIG. 5. Note that the broken lines shown in FIG. 4 are merely schematic, and the dicing operation to dice the package main body is not just along only the broken lines shown in FIG. 4.

FIG. 5 shows a schematic cross-sectional view of a package according to some embodiments.

As shown in FIG. 5, the package may include one chip 11 and two segmented chip connectors 15. Additional electronic devices 150 may be placed and assembled over the package. As mentioned above, additional electronic device(s) 150 may also be integrated into the metal layer 17. As shown in FIG. 5, the additional electronic device(s) 150 may be electrically coupled to the encapsulated chip 11 in the package via third bumps 20, a segmented portion 17s of the metal layer 17, the through vias in one or more chip connectors 15 or one or more segmented sections thereof, and a segmented portion 18s of the redistribution layer 18. In other embodiments, the package structure may be segmented in other manners. For example, the package may be formed to contain one chip 11 and one chip coupler 15.

In some embodiments, the process of forming the package may also performed by removing the carrier 100 and then forming the redistribution layer 18 and the plurality of second bumps 19, before thinning the molded package structure 16 and forming the metal layer 17 thereon, resulting in a completed package structure that are subsequently diced to obtain individual packages.

FIGS. 6 to 9 are cross-sectional views schematically illustrating a package including multiple chip layers being formed in process 101 of forming a package according to some embodiments.

Figure 6:
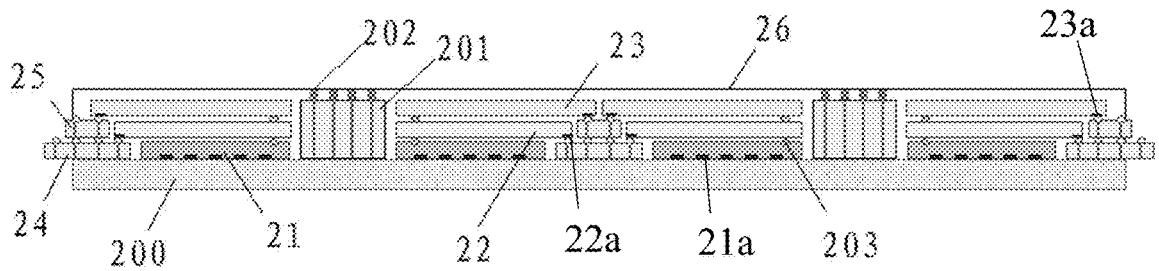

FIG. 6 shows a schematic cross-sectional view of a molded package structure including multiple encapsulated chip layers on a carrier substrate after Steps 110 and 120 are performed to form the molded package structure.

As shown in FIG. 6, three chip layers are placed or assembled on the carrier 200. A first chip layer adjacent the carrier 200 includes a plurality of first chips 21 and a plurality of first chip couplers 24. A second chip layer above and adjacent the first chip layer includes a plurality of second chips 22 and a plurality of second chip connectors 25. A third chip layer above and adjacent the second chip layer comprises a plurality of third chips 23. Further, a plurality of cross-layer chip couplers 201 are also placed on the carrier 200. A plurality of first bumps 202 are disposed on the cross-layer chip connectors 201. In some embodiments, the plurality of first bumps 202 may be in the form of metal pillars (e.g., copper pillars).

In some embodiments, the height of the cross-layer chip connector in the vertical direction (e.g., the direction perpendicular to the surface of the carrier 200 on which the chip layers are assembled) may correspond to or be consistent with the height of the multiple chip layers in the package structure. For example, as shown in FIG. 6, the height of the cross-layer chip coupler 201 may correspond to or coincide with the height of three chip layers.

In some embodiments, the cross-layer chip connector may be one complete chip connector, i.e. the cross-layer chip connector may be integrally formed. The cross-layer chip connector may also be formed by stacking and assembling a plurality of chip connectors together. In the cross-sectional schematic view, the width of the cross-layer chip connector in the horizontal direction may be uniform from top to bottom, or may vary from the top to bottom.

In some embodiments, when placing and assembling the multiple chip layers, the first plurality of chips 21, the first plurality of chip couplers 24, and the cross-layer chip connectors 201 may be first placed or assembled on the carrier 200, then the second plurality of chips 22 and the second plurality of chip couplers 25 may be placed and assembled on the first chip 11 and the first plurality of chip couplers 24, and finally the third plurality of chips 23 may be placed and assembled on the second plurality of chips 22 and the second plurality of chip couplers 25. In some embodiments, the first chips 21, the second chips 22, and the third chips 23 are placed face down (e.g., having their front surfaces, or the surfaces with chip contacts or terminals 21a, 22a, and 23a. respectively, facing the carrier 200).

In some embodiments, the package structure as shown in FIG. 6-9 may contain only two chip layers. For example, the first or second chip layer may be skipped, leaving only the second or first chip layer and the third chip layer.

In some embodiments, the package structure as shown in FIG. 6-9 may include one or more other chip layers. Each of the one or more other chip layers may include a plurality of chips and a plurality of additional chip connectors. The plurality of additional chip couplers may be stacked and assembled under the first chip coupler 24, and the plurality of chips may be stacked and assembled under the first chips 21. In some embodiments, the size or area of each chip coupler in a particular layer in the horizontal direction may not be the same in the stack formed by the layers of additional chip couplers, the first chip coupler 24 and the second chip coupler 25. For example, in the stack, the size or area of the chip connector in any layer may be smaller or larger than the size or area of the chip connector below or above. For example, the stack formed by the chip couplers in each chip layer may have a staircase shape, a pyramidal shape, an inverted staircase shape, an inverted pyramidal shape, or the like. In some embodiments, the stack formed by the chip couplers in different chip layers may also be integrally formed.

As shown in FIG. 6, the first chip layer, the second chip layer and the third chip layer on the carrier 200 have been molded, thereby forming the molded package structure 26.

Adhesive dots (adhesive dots) may also be provided herein between different chip layers (e.g., adhesive dots 203 in FIG. 6-9). The adhesive dots serve to separate and secure the different chip layers. In some embodiments, the adhesive dots are made of a non-conductive medium. Hereinafter, the description of the adhesive dots will be omitted.

Figure 7:
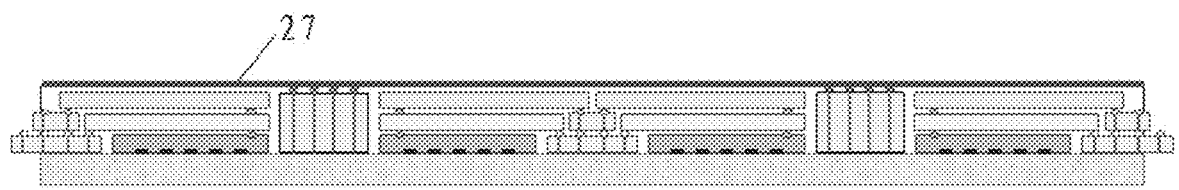

FIG. 7 shows a cross-sectional schematic diagram of a package structure including multiple chip layers after Step 130 is performed.

As shown in FIG. 7, the package structure 26 may be thinned to expose the plurality of first bumps 202. Then, a metal layer 27 is formed on the package structure 26. In some embodiments, the metal layer 27 is electrically connected to the plurality of first bumps 202. In some embodiments, the metal layer may include a plurality of metal lines, at least one of the plurality of metal lines being connected to at least one of the plurality of first bumps 202.

Figure 8:
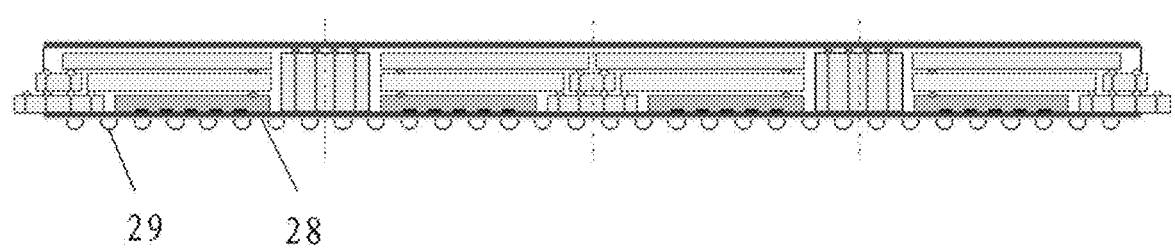

FIG. 8 shows a cross-sectional schematic view of a package structure including multiple chip layers after Step 140 is performed according to some embodiments.

As shown in FIG. 8, the carrier 200 may be removed to form a package main body. Then, a redistribution layer 28 and second bumps 29 are formed on the lower side of the package main body (e.g., the side of the package main body facing away from the metal layer). Finally, the package structure shown in FIG. 8 is diced along the broken line shown in FIG. 8 to obtain individual packages, e.g., a package as shown in FIG. 9. Note that the broken lines shown in FIG. 8 are merely schematic, and the dicing operation to dice the package main body is not just along only the broken lines shown in FIG. 8.

FIG. 9 shows a schematic cross-sectional view of a package including an encapsulated chip stack according to some embodiments.

As shown in FIG. 9, the package may include a first chip 21, a second chip 22 stacked over the first chip 21, a third chip 23 stacked over the second chip 22, a first chip coupler segment 24, a cross-layer chip coupler segment 201, and a second chip coupler segment 25 stacked over the first chip coupler segment. Additional electronic devices 250 may be placed and assembled over the package. Additional electronic devices 250 may also be integrated into the metal layer 27, as described above. As shown in FIG. 9, the additional electronic device(s) 250 may be electrically coupled to the encapsulated first chip 21, second chip 22, and/or third chip 23 in the package via the third bumps 30, a segmented portion 27s of the metal layer 27, the through vias in one or more chip connectors 201 and/or 24 and/or 25, and/or one or more segmented sections thereof, and a segmented portion 28s of the redistribution layer 28. In other embodiments, the package structure may be segmented in other manners.

In other embodiments, the process of forming the package may also performed by removing the carrier 200 and then forming the redistribution layer 28 and the plurality of second bumps 29, before thinning the molded package structure 26 and forming the metal layer 27 thereon, resulting in a completed package structure that are subsequently diced to obtain individual packages.

FIGS. 10 to 13 are cross-sectional views schematically illustrating a package including multiple chip layers being formed in process 101 of forming a package according to some embodiments.

FIG. 10 shows a schematic cross-sectional view of a molded package structure including multiple encapsulated chip layers on a carrier substrate after Steps 110 and 120 are performed to form the molded package structure.

As shown in FIG. 10, two chip layers are placed or assembled on the carrier 300. A first chip layer adjacent the carrier 300 includes a plurality of first chips 31 and a plurality of first chip couplers 33. A second chip layer above and adjacent the first chip layer includes a plurality of second chips 32 and a plurality of second chip connectors 34. Further, a plurality of cross-layer chip couplers 302 are also placed on the carrier 300. A plurality of first bumps 302 are disposed on the cross-layer chip connectors 302 and, in some embodiments, also on the second chip connectors 34, as shown in FIG. 10. In some embodiments, the plurality of first bumps 302 may be in the form of metal pillars (e.g., copper pillars). Adhesive dot 303 may be provided between the first chips 31 and the second chips 32.

In some embodiments, the height of the cross-layer chip connector 302 in the vertical direction may correspond to or be consistent with the height of the chip layers in the package. For example, as shown in FIG. 10, the height of the cross-layer chip coupler 301 may correspond to or coincide with the height of two chip layers.

In some embodiments, in placing and assembling two chip layers, the plurality of first chips 31, the plurality of first chip couplers 33, and the plurality of cross-layer chip connectors 301 may be first placed on the carrier 300, and then the plurality of second chips 32 and the plurality of second chip couplers 35 may be placed and assembled on the first chips 31 and the plurality of first chip couplers 33. In some embodiments, the first chip 31 and the second chip 32 are placed face down (e.g., having their front surfaces, or the surfaces with chip contacts or terminals, facing the carrier 300).

In some embodiments, the package structure as shown in FIG. 10-13 may include one or more other chip layers. Each of the one or more other chip layers may include a plurality of chips and a plurality of additional chip connectors. The plurality of additional chip couplers may be stacked and assembled under the first chip coupler 33, and the plurality of chips may be stacked and assembled under the first chips 31. In some embodiments, the size or area of each chip coupler in a particular layer in a horizontal direction (e.g., area of a cross-section parallel to a surface of the carrier over which the chip layers are assembled) may not be the same in the stack formed by the layers of additional chip couplers, the first chip coupler 33 and the second chip coupler 34. For example, in the stack, the size or area of the chip connector in any layer may be smaller or larger than the size or area of the chip connector below or above. For example, the stack formed by the chip couplers in each chip layer may have a staircase shape, a pyramidal shape, an inverted staircase shape, an inverted pyramidal shape, or the like. In some embodiments, the stack formed by the chip couplers in different chip layers may also be integrally formed.

As shown in FIG. 10, the first chip layer and the second chip layer on carrier 300 have been molded, thereby forming the molded package structure 36.

FIG. 11 shows a cross-sectional schematic diagram of a package structure including multiple chip layers after Step 130 is performed.

As shown in FIG. 11, the molded package structure 36 may be thinned to expose the plurality of first bumps 302. Then, a metal layer 37 is formed on the package structure 36. In some embodiments, the metal layer 37 is electrically connected to the plurality of first bumps 302. In some embodiments, the metal layer may include a plurality of metal lines, at least one of the plurality of metal lines connecting at least one of the plurality of first bumps 302.

FIG. 12 shows a cross-sectional schematic view of a package structure including multiple chip layers after Step 140 is performed according to some embodiments.

As shown in FIG. 12, the carrier 300 may be removed to form a package main body. Then, a redistribution layer 38 and a second bump 39 are formed on the lower side of the package main body (e.g., the side of the package main body facing away from the metal layer). Finally, the package main body shown in FIG. 12 is diced along the broken line shown in FIG. 12 to form a package as shown in FIG. 13. Note that the broken lines shown in FIG. 12 are merely schematic, and the dicing operation to dice the package main body is not just along only the broken lines shown in FIG. 12.

FIG. 13 shows a schematic cross-sectional view of a package according to some embodiments.

As shown in FIG. 13, the package may include a first chip 31, a second chip 32 stacked over the first chip, a first chip coupler segment 33, a cross-layer chip coupler segment 301, and a second chip coupler segment 34 stacked over the first chip coupler segment. Additional electronic devices 350 may be placed and assembled over the package. As described above, additional electronic devices 350 may also be integrated into the metal layer 37. As shown in FIG. 13, the additional electronic device(s) 350 may be electrically coupled to the encapsulated first chip 31 and/or second chip 32 in the package via a segmented portion of the metal layer 37, the through vias in one or more chip connectors 301 and/or 33 and 34, or one or more segmented sections thereof, and a segmented portion of the redistribution layer 38. In other embodiments, the package structure may be diced or segmented in other manners, so instead of including chip coupler segments, a package can include whole chip coupler(s).

In other embodiments, the process of forming the package may also be performed by removing the carrier 300 and then forming the redistribution layer 38 and the plurality of second bumps 39, before thinning the molded package structure 36 and forming the metal layer 37 thereon, resulting in a completed package structure that are subsequently diced to obtain individual packages.

Herein, the designation of individual chips and chip connectors may not be as defined above without changing the coupling relationship between the components in the package. For example, the designations of the first chip, the second chip, or the third chip may be interchanged with one another, the designations of the first chip connector, the second chip connector, the third chip connector, and the fourth chip connector may be interchanged with one another, and the designations of the first bump and the second bump may also be interchanged with one another.

In various embodiments, the individual chips in the package may be coupled to various circuit structures and electronic devices outside the package not only with chip connectors, redistribution layers, and/or metal layers to each other, but also with chip connectors, metal layers, redistribution layers, and/or bumps.

As is well known to those skilled in the art, the bumps may be made of a conductive material or solder, including Cu, Ni, Au, Ag, etc., or other alloy materials, as well as other materials. In some embodiments, the bump may be a pad or may be in the shape of a pillar (e.g., a copper pillar), but may have other possible forms.

The foregoing has outlined features of several embodiments so that those skilled in the art may better understand the various aspects of the present invention. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   at least one chip and at least one chip coupler encapsulated in a molding compound to form a package body having a first side and an opposing second side;
   a redistribution layer formed on the first side of the package body, each of the at least one chip having a front side facing the redistribution layer and chip contacts formed on the front side and coupled to the redistribution layer, the at least one chip coupler including at least one first chip coupler having an upper side facing away from the redistribution layer and first bumps formed on the upper side;
   a metal layer formed on the second side of the package body and electrically coupled to at least some of the first bumps without soldering;
   a plurality of second bumps disposed on a side of the redistribution layer facing away from the package body;
   one or more electronic devices over the metal layer, the one or more electronic devices including one or more of: one or more integrated circuit modules, one or more micro-electro-mechanical systems, optoelectronic devices, and one or more passive devices; and
   third bumps between the one or more electronic devices and the metal layer.

2. The package of claim 1, wherein the at least one chip coupler includes active and/or passive coupling devices, wherein the first chip coupler includes through vias, and wherein the first bumps are formed on an upper surface of the first chip coupler and disposed between the through vias and the metal layer.

3. The package of claim 1, wherein the at least one chip includes a first chip electrically coupled to the metal layer through the at least one chip coupler and the redistribution layer.

4. The package of claim 1, wherein the at least one chip coupler includes through vias formed in a material selected from one or more semiconductor materials, glass, and ceramic, the one or more semiconductor materials including silicon, silicon carbide, gallium arsenide, and gallium nitride.

5. The package of claim 1, wherein:
the at least one chip includes a first chip and a second chip;
the at least one chip coupler further includes at least one second chip coupler; and
the second chip is stacked over the first chip and the at least one second chip coupler.

6. The package of claim 5, wherein the at least one first chip coupler includes at least one cross-layer chip coupler having a height corresponding to a height of at least two stacked chips.

7. The package of claim 5, wherein:
the at least one first chip coupler include at least one third chip coupler stacked over the at least one second chip coupler.

8. The package of claim 7, wherein the at least one first chip coupler further includes a cross-layer chip coupler, having a height corresponding to a height of at least two stacked chips.

9. The package of claim 1, wherein the first chip coupler further includes conductive traces on at least the upper surface of the first chip coupler.

10. The package of claim 1, wherein the at least one chip includes a first chip, and wherein the at least one chip coupler includes two chip couplers flanking the first chip, each of the two chip couplers including conductive vias through a segment of a semiconductor material.

11. The package of claim 1, wherein the molding compound embeds the at least one chip and the at least one chip coupler while exposing the first bumps.

12. A package, comprising:
a package body having a first side and an opposing second side;
a redistribution layer formed on the first side of the package body;
at least one chip and at least one chip coupler encapsulated in the package body, the at least one chip including a first chip having a front side facing the redistribution layer and first chip contacts on the front side that are coupled to the redistribution layer, the at least one chip coupler including first bumps on the second side of the package body and conductive vias coupling the first bumps to the redistribution layer;
a metal layer formed on the second side of the package body and coupled to the first bumps without soldering;
a plurality of second bumps formed on a side of the redistribution layer facing away from the package body;
one or more electronic devices over the metal layer, the one or more electronic devices including one or more of: one or more integrated circuit modules, one or more micro-electro-mechanical systems, optoelectronic devices, and one or more passive devices; and
third bumps between the one or more electronic devices and the metal layer.

13. The package of claim 12, wherein the at least one chip coupler includes active and/or passive coupling devices, and wherein the first bumps are formed on at least one surface of the at least one chip coupler and disposed between the conductive vias and the metal layer.

14. The package of claim 12, wherein the first chip is electrically coupled to the metal layer through the redistribution layer and at least one of the at least one chip coupler.

15. The package of claim 12, wherein the at least one chip coupler is formed using a material selected from one or more semiconductor materials, glass and ceramic, and wherein the conductive vias are formed in the material.

16. The package of claim 12, wherein:
the at least one chip coupler further includes a first chip coupler and a second chip coupler stacked over a first part of the first chip coupler;
the at least one chip further includes a second chip stacked over the first chip and a second part of the first chip coupler; and
each of the first chip and the second chip is coupled to the metal layer via the redistribution layer and at least the first and second chip couplers.

17. The package of claim 12, wherein the at least one chip further includes a second chip stacked over the first chip, and the at least one chip coupler includes at least one cross-layer chip coupler having a height corresponding to a height of at least two stacked chips.

18. The package of claim 17, wherein:
the at least one chip coupler further includes a first chip coupler and a second chip coupler stacked over a first part of the first chip coupler; and
the second chip is stacked over the first chip and a second part of the first chip coupler.

19. The package of claim 12, wherein the at least one chip includes a first chip, and wherein the at least one chip coupler includes two chip couplers flanking the first chip, each of the two chip couplers including a segment of a semiconductor material having a height about the same as the first chip and conductive through conductive vias through a segment of a semiconductor material.

20. The package of claim 12, wherein the package body includes a molding compound embedding the at least one chip and the at least one chip coupler while exposing the first bumps.

* * * * *